United States Patent [19]

Kovalick et al.

[11] 4,331,941

[45] May 25, 1982

[54] DIGITAL PHASE DOMAIN AMPLITUDE MODULATION METHOD AND APPARATUS

[75] Inventors: Al Kovalick, Santa Clara; Rolly Hassun, San Carlos, both of Calif.

[73] Assignee: Hewlett-Packard Company, Palo Alto, Calif.

[21] Appl. No.: 126,083

[22] Filed: Feb. 29, 1980

[51] Int. Cl.³ .............................................. H03C 1/50
[52] U.S. Cl. .................................. 332/31 R; 328/168; 332/9 R; 455/116
[58] Field of Search ...................... 332/9 R, 9 T, 16 R, 332/16 T, 17, 31 R, 31 T, 44, 45; 375/23, 41, 42, 43, 44, 52, 67; 455/116; 328/168

[56] References Cited

U.S. PATENT DOCUMENTS

| | | | |
|---|---|---|---|
| 3,958,191 | 5/1976 | Jones, Jr. ......................... | 332/9 R X |
| 3,988,540 | 10/1976 | Scott et al. ...................... | 332/9 R X |
| 4,100,369 | 7/1978 | Stenstrom et al. ................. | 375/67 |

*Primary Examiner*—Siegfried H. Grimm
*Attorney, Agent, or Firm*—Edward Y. Wong; Theodore Scott Park

[57] ABSTRACT

A modulating signal is applied to an analog-to-digital converter which addresses a read-only memory phase look-up table. The read-only memory phase look-up table output is applied to a polarity generator. The polarity generator output and output from a phase accumulator are input to a phase adder. The phase adder output is applied to the input of a sine look-up read-only memory whose output is applied to a digital-to-analog converter and low-pass filtered to produce an amplitude-modulated carrier signal. The invention thereby digitally amplitude modulates a carrier signal in the phase domain without any multiplication being required.

24 Claims, 13 Drawing Figures

COMPONENTS SPECTRA OF EQ (3)

COMPONENTS SPECTRA OF EQ (4)

SPECTRUM OF EQ (5)

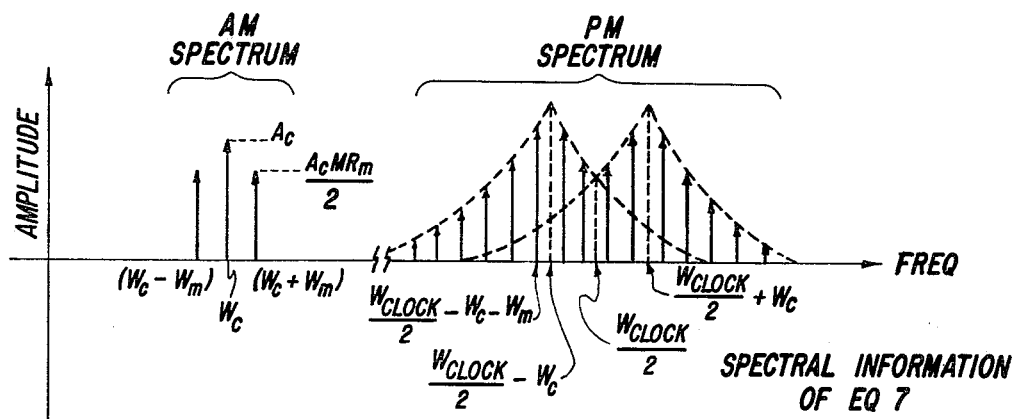
FIG. 6A  SPECTRAL INFORMATION OF EQ 7
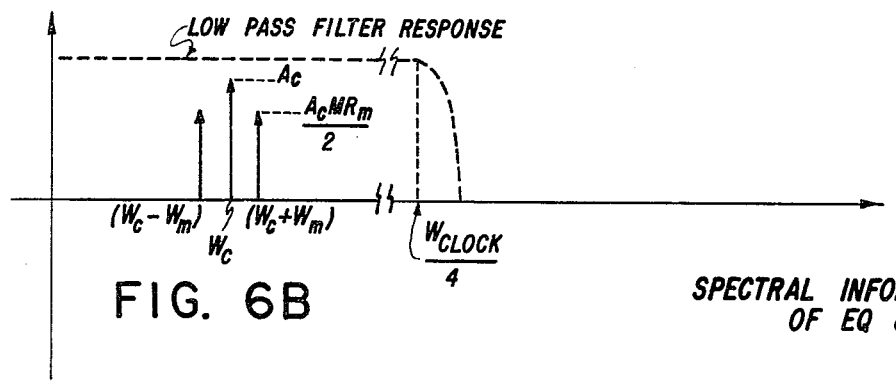
FIG. 6B  SPECTRAL INFORMATION OF EQ 8
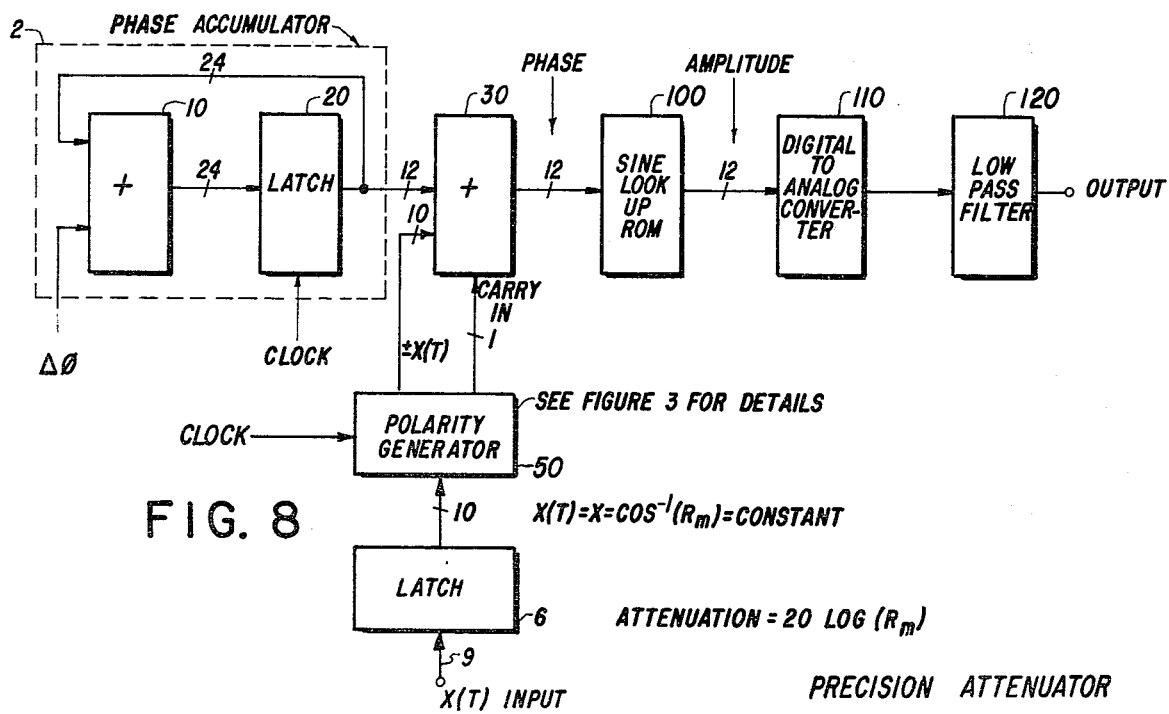
FIG. 8
$X(T) = X = \cos^{-1}(R_m) = CONSTANT$
ATTENUATION $= 20 \log (R_m)$
PRECISION ATTENUATOR

TWO TONE SSB USING DSBSC

DIGITAL PHASE DOMAIN AMPLITUDE MODULATION METHOD AND APPARATUS

BACKGROUND OF THE INVENTION

A known method for synthesizing sine waves is to generate harmonic frequencies from a reference clock and filter a selected harmonic frequency to obtain a desired frequency output. Another known method is to use a phase-locked loop having a digital divider in its feedback loop. Neither of these methods allows for phase continuous switching of the carrier, and both methods require extensive analog components which are subject to drift and malfunction through aging, temperature effects and the like.

A digital signal generator synthesizer is useful to avoid the above problems. A block diagram of a typical digital synthesizer known to the art is shown in FIG. 1. The defining relationship for frequency is $F=(\Delta\phi/\Delta T)(\frac{1}{2}\pi)$. If $\Delta T$ is the period of the digital clock, then $\Delta T$ uniquely defines a frequency. It is known that frequency and phase modulation are simply obtainable from this synthesizer. Amplitude modulation, AM hereafter, is more difficult and is typically provided by a multiplier either before or after the digital-to-analog converter. If the multiplier is after the digital-to-analog converter, the structure takes the form of a common AM analog modulator. If the multiplier is inserted before the digital-to-analog converter, a complex digital multiplier is required.

Amplitude modulating after the digital-to-analog conversion is disadvantageous in that it prevents the entire generator from being in digital form. Also, the modulation index is not digitally controllable in a simple manner, and the analog multiplier degrades the carrier in terms of harmonics and spurious signal generation.

A digital multiplier approach eliminates these problems. Referring to FIG. 2, a typical arrangement for sine wave carrier amplitude modulation is shown. The modulating source may be any random wave with higher frequencies filtered to prevent aliasing. The carrier term sin (WcT) is typically derived from a ROM look-up phase-to-amplitude converter. The modulation term is $1+MRm(T)$, where M is the modulation index and Rm(T) is the modulating wave. This approach, although digital, presents several additional problems. The maximum carrier frequency is limited by the speed of the multiplier.

To reduce the spurious signals that result from too coarse an amplitude resolution at least 10 bits are typically needed thereby requiring a $10 \times 10$ type multiplier. State-of-the-art multipliers of this size are very complex. Maximum speed is about 90 nsec. per multiplication, and the addition of the multiplier and the $1+MRm(T)$ generator approximately doubles the complexity of a synthesizer.

SUMMARY OF THE INVENTION

A modulating signal is applied to an analog-to-digital converter which addresses a read-only memory phase look-up table. The read-only memory phase look-up table output is applied to a polarity generator. The polarity generator output and output from a phase accumulator are input to a phase adder. The phase adder output is applied to the input of a sine look-up read-only memory whose output is applied to digital-to-analog converter and low-pass filtered to produce an amplitude-modulated carrier signal. The invention thereby digitally amplitude modulates a carrier signal in the phase domain without any multiplication being required.

DESCRIPTION OF THE DRAWING

FIGS. 6A and 6B show frequency spectra of an amplitude modulation spectrum and a phase modulation spectrum present in the operation of the preferred embodiment.

FIG. 8 is a block diagram of another preferred embodiment which provides precise carrier attenuation with exceptional resolution.

DESCRIPTION OF THE PREFERRED EMBODIMENT

Figure 3:
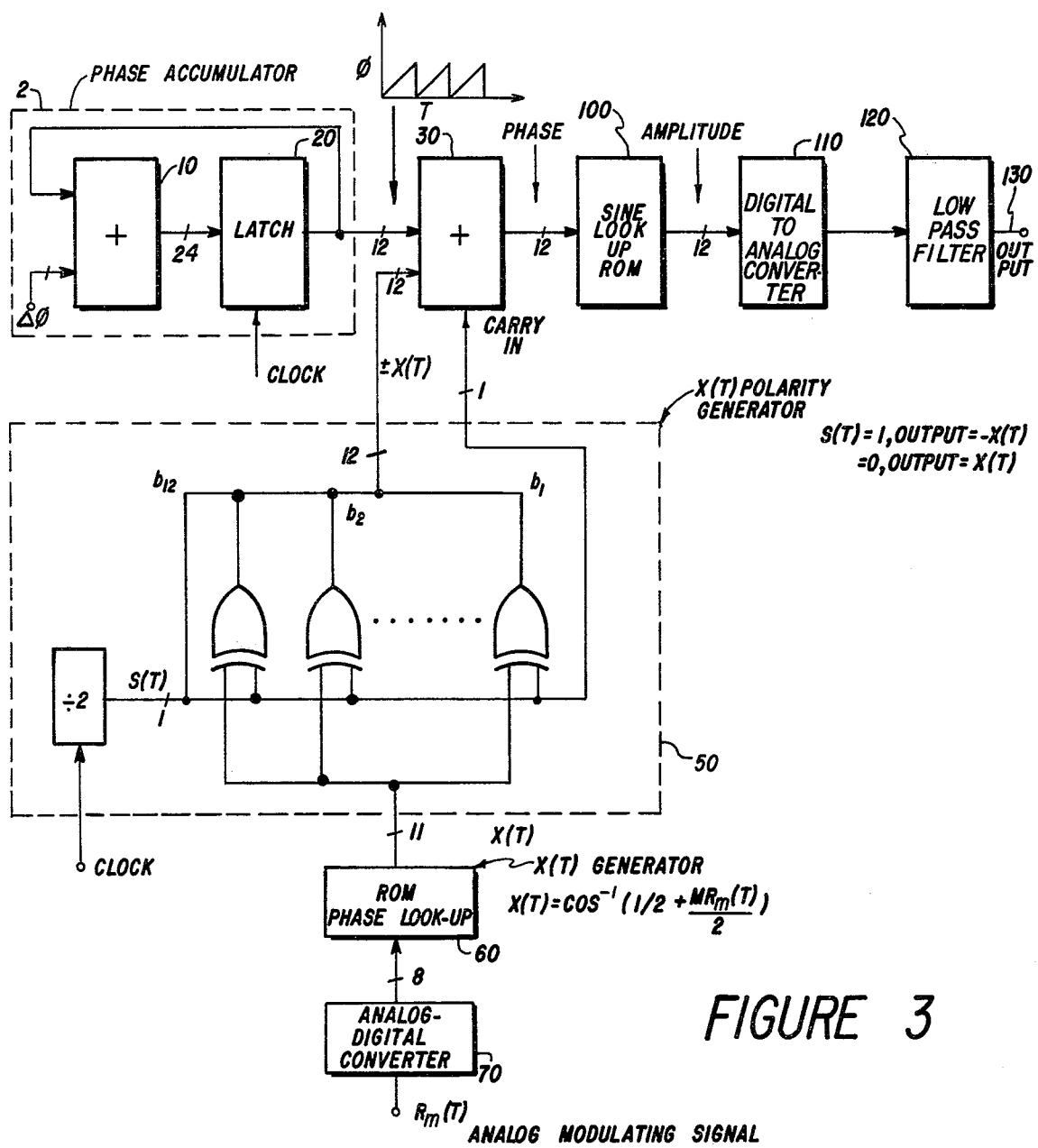
FIG. 3 is a block diagram of a preferred digital amplitude modulator built in accordance with the invention.

The present invention permits amplitude modulation to be made in the phase domain with no multiplication required. This eliminates the need for a large multiplier as required in the prior art. Referring to FIG. 3, a block diagram of a digital synthesizer with amplitude modulation is shown. The operation of the present invention is as follows:

Amplitude modulation can be understood to be a special case of phase modulation. It is possible to phase modulate a carrier in such a way that both amplitude and phase modulation are a result. If the phase modulation terms are eliminated, then only AM results.

Figure 5A:
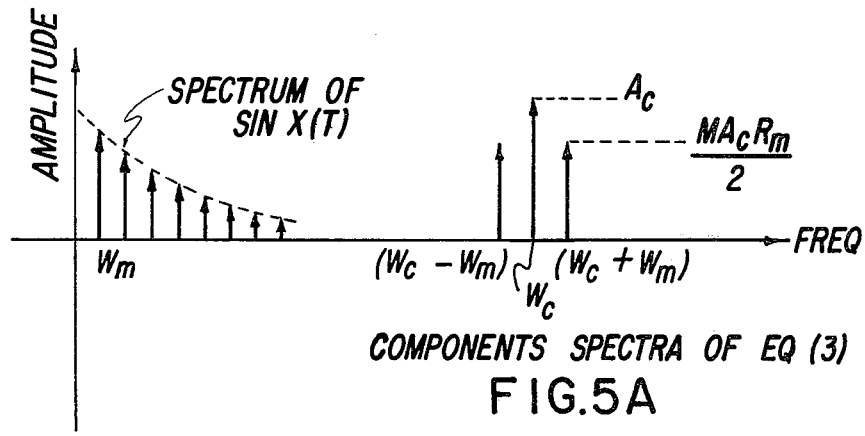
FIGS. 5A, 5B and 5C show simplified spectra of a phase-modulated signal and a pure amplitude-modulated signal.
Figure 5B:
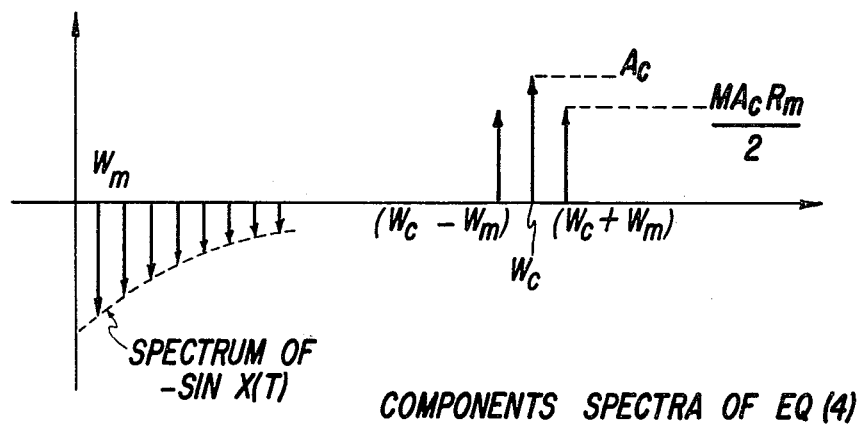

To understand how this is achieved, consider the function, $$\text{SIN}(W_cT+X) \qquad (1)$$

where Wc is the carrier radial frequency and X is a constant phase offset. Let the phase offset be a continuous function of time represented by X(T), $$X(T)=\text{COS}^{-1}[0.5(1+MRm(T))] \qquad (2)$$

where Rm(T) is the modulating source and M is the modulation index. Now, using X(T), generate two phase-modulated waves G1(T) and G2(T). Using trigonometric identities, the right sides can be shown to equal the left sides respectively. Referring to the drawings, FIG. 5A shows components spectra of equation (3) and FIG. 5B shows components spectra of equation (4) below. For clarity, the spectrum of COS (WcT) SIN [X(T)] has been shifted to the origin in FIGS. 5A and 5B. The COS (WcT) SIN [X(T)] term actually falls around the carrier, Wc. To clarify the picture only the base term SIN [X(T)] is shown. The COS (WcT) term UP translates the SIN [X(T)] term around the carrier.

$$G1(T) = SIN(WcT + X(T)) = \qquad (3)$$

$$SIN(WcT)\left[\tfrac{1}{2} + \frac{MRm(T)}{2}\right] + COS(WcT)\sin[X(T)]$$

$$G2(T) = SIN(WcT - X(T)) = \qquad (4)$$

$$SIN(WcT)\left[\tfrac{1}{2} + \frac{MRm(T)}{2}\right] - COS(WcT)\sin[X(T)]$$

Figure 5C:
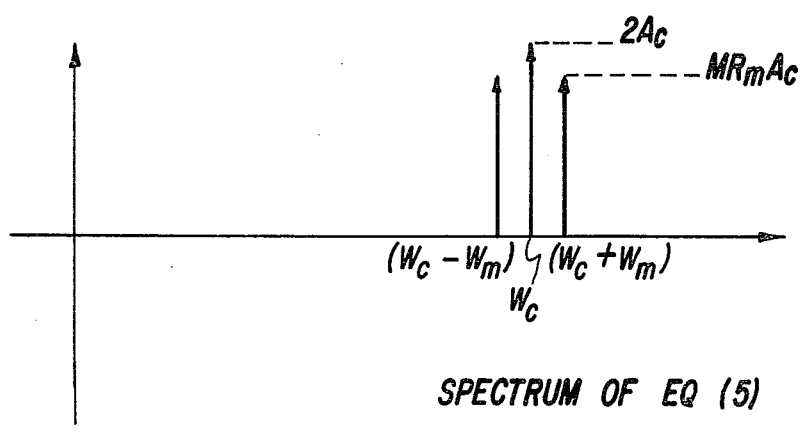

Referring to FIG. 5C, the sum of these two phase-modulated waves reveals an interesting property, $$G1(T)+G2(T)=\sin(WcT)(1+MRm(T)). \qquad (5)$$

The result is the traditional form for pure amplitude modulation. Note that if all phase modulation is cancelled, only AM results. The above is true for continuous analog signals.

Using digital techniques, equation (5) is generated with the addition of terms, G3(T), around the frequency Fclock/2. These terms are easily filtered by an output low-pass filter.

$$SIN(WcT)(1+MRm(T))+G3(T) \qquad (6)$$

thus, (6) reduces to equation (5) after filtering by a low-pass filter.

To generate (6) consider the function S(T) defined as a square wave with positive amplitude=+1 and negative amplitude=−1. The repetition rate is Fclock/2. Using S(T) equations (3) and (4) can be represented in a combined form by using trigonometric identities and equation (7) results:

$$SIN(WcT+S(T)X(T))=SIN(WcT)COS(X(T))+COS(WcT)S(T)SIN[X(T)] \qquad (7)$$

The right-most term, COS (WcT)S(T) SIN [X(T)], has a very complex frequency spectrum. This is the same undesired term as appears in equations (3) and (4) with one exception. The S(T) square wave causes the PM term to be translated up in frequency. Thus, the first undesired spectral lines occur around Fclock/2. If the output low-pass filter LPF is designed to reject these components and all those higher in frequency, then equation (7) reduces to:

$$SIN(WcT+S(T)X(T))_{LPF}=SIN(WcT)(1+MRm(T)) \qquad (8)$$

Figure 4:
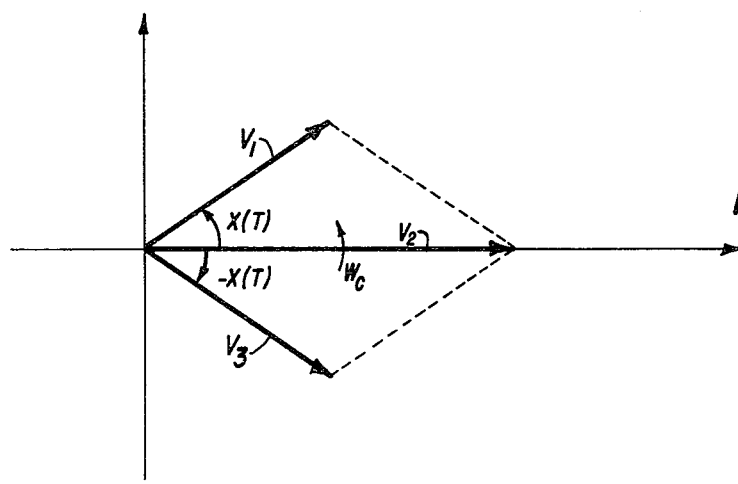
FIG. 4 is a vector diagram illustrating the amplitude modulation method.

Indeed as Fclock approaches infinity the COS (WcT)S(T) SIN [X(T)] term does also and the only remaining signal is the AM spectrum. See FIGS. 6A and 6B for spectral information of equations (7) and (8). Notice that equation (8) is equivalent to the continuous result equation (5). Equation (7) can be visualized by reference to FIG. 4. The carrier is represented by a rotation vector V2. Each cycle of the digital clock causes either X(T) or −X(T) to phase modulate the carrier. The results are V1 and V3 respectively. This causes both AM and PM. As already mentioned, the PM is filtered by the output LPF. The AM results due to the resultant vector (V2=V1+V3) being projected onto the X axis with vector V2 rotating at the carrier rate. As the modulating wave Rm(T) varies, the X(T) term is of the correct magnitude so that the V2 carrier amplitude changes proportionally to Rm(T).

Figure 1:
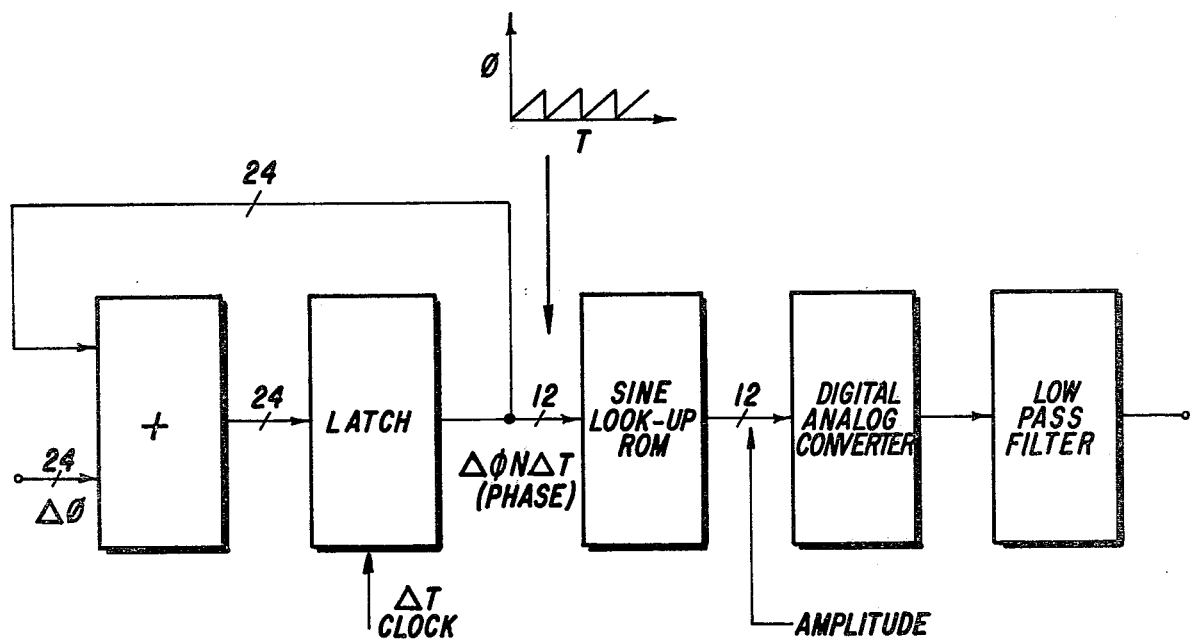
FIG. 1 is a block diagram of a prior art digital synthesizer.
Figure 2:
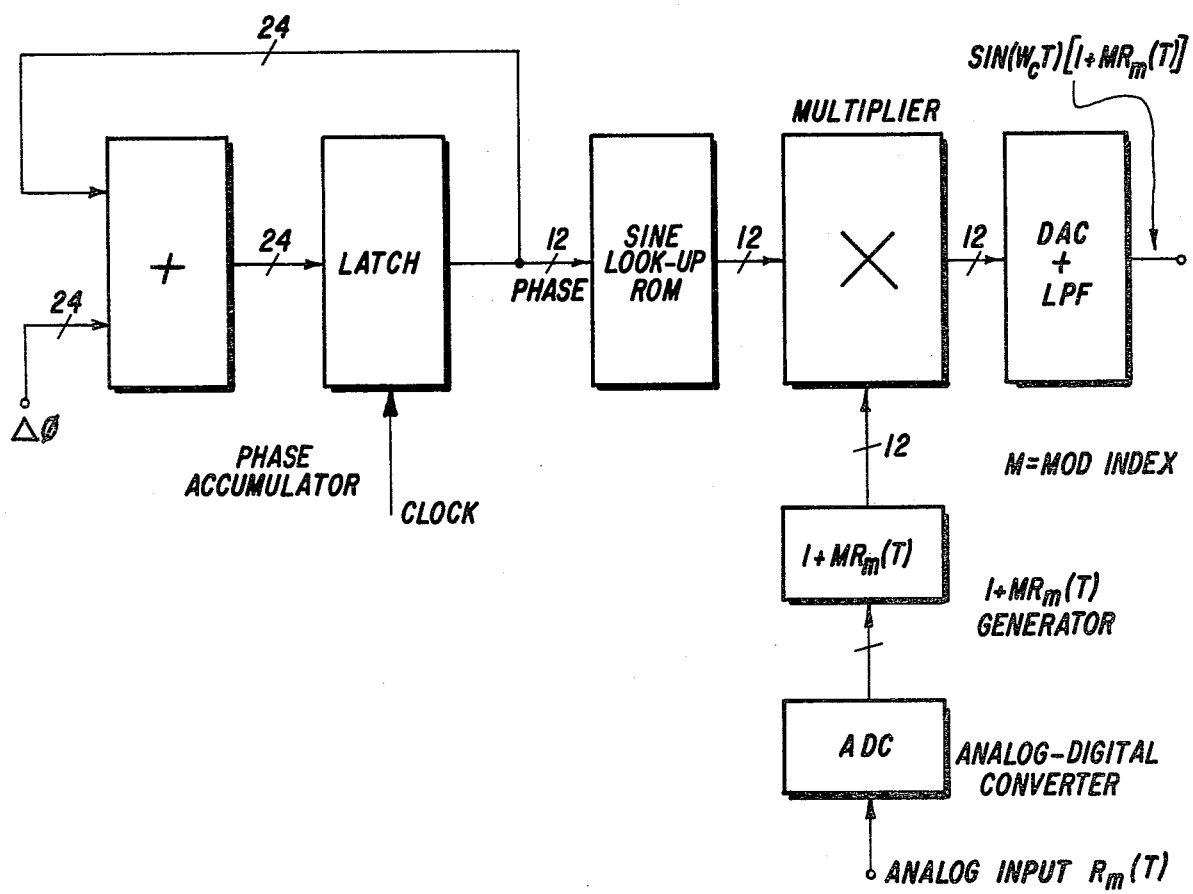
FIG. 2 is a block diagram of a prior art digital synthesizer with amplitude modulation.

Referring to FIG. 3 and the block diagram, it is seen that the only speed-critical part that has been added to perform AM is an adder 30. This addition effectively replaces the multiplier as used in the prior art as depicted in FIG. 2 thereby providing a method for generating AM which allows a faster clock and thus higher carrier rates. The hardware is also considerably reduced as compared to the prior art multiplier approach.

Referring to FIG. 3, a phase accumulator 20 comprised of an adder 10 and a latch 20 accumulates a linearly increasing phase. A differential phase $\Delta\phi$ value 4 determines the output carrier rate. An external controller provides the $\Delta\phi$ and $\Delta T$ clock inputs. Another input to the adder 30 is derived from the AM phase generator. This function is comprised of a polarity generator 50, an amplitude-to-phase generator ROM phase look-up table 60, and an analog-to-digital converter 70. The contents of the ROM 60 for AM with a 100% modulation index is given in Table 1 below. The ROM 60 is 256 words by 11 bits, and the given values are in octal and $\phi=\phi$ radians, 2777=$\pi$ radians:

TABLE 1

| Byte location decimal: | 1-64 | 65-128 | 129-192 | 193-256 |
|---|---|---|---|---|
| | 1241 | 13 | 1264 | 1777 |
| | 1230 | 27 | 1275 | 1777 |
| | 1216 | 42 | 1306 | 1777 |
| | 1205 | 55 | 1317 | 1776 |
| | 1173 | 71 | 1330 | 1775 |
| | 1162 | 104 | 1340 | 1774 |
| | 1150 | 117 | 1351 | 1773 |
| | 1136 | 132 | 1362 | 1771 |
| | 1124 | 146 | 1372 | 1770 |
| | 1113 | 161 | 1403 | 1766 |
| | 1101 | 174 | 1413 | 1764 |
| | 1067 | 207 | 1423 | 1761 |
| | 1055 | 223 | 1433 | 1757 |
| | 1042 | 236 | 1443 | 1754 |
| | 1030 | 251 | 1453 | 1752 |
| | 1016 | 264 | 1463 | 1747 |
| | 1004 | 300 | 1473 | 1744 |
| | 772 | 313 | 1502 | 1740 |
| | 757 | 326 | 1512 | 1735 |
| | 745 | 341 | 1521 | 1731 |
| | 732 | 354 | 1530 | 1725 |
| | 720 | 367 | 1540 | 1721 |
| | 705 | 402 | 1547 | 1715 |
| | 673 | 415 | 1555 | 1711 |
| | 660 | 430 | 1564 | 1704 |
| | 646 | 443 | 1573 | 1677 |
| | 633 | 456 | 1601 | 1672 |
| | 620 | 471 | 1610 | 1665 |
| | 606 | 504 | 1616 | 1660 |
| | 573 | 517 | 1624 | 1653 |
| | 560 | 532 | 1632 | 1645 |
| | 545 | 545 | 1640 | 1640 |
| | 532 | 560 | 1645 | 1632 |
| | 517 | 573 | 1653 | 1624 |
| | 504 | 606 | 1660 | 1616 |
| | 471 | 620 | 1665 | 1610 |
| | 456 | 633 | 1672 | 1601 |
| | 443 | 646 | 1677 | 1573 |
| | 430 | 660 | 1704 | 1564 |
| | 415 | 673 | 1711 | 1555 |
| | 402 | 705 | 1715 | 1547 |
| | 367 | 720 | 1721 | 1540 |
| | 354 | 732 | 1725 | 1530 |
| | 341 | 745 | 1731 | 1521 |
| | 326 | 757 | 1735 | 1512 |
| | 313 | 772 | 1740 | 1502 |
| | 300 | 1004 | 1744 | 1473 |
| | 264 | 1016 | 1747 | 1463 |
| | 251 | 1030 | 1752 | 1453 |
| | 236 | 1042 | 1754 | 1443 |
| | 223 | 1055 | 1757 | 1433 |

TABLE 1-continued

| Byte location decimal: | 1-64 | 65-128 | 129-192 | 193-256 |
|---|---|---|---|---|
| | 207 | 1067 | 1761 | 1423 |
| | 174 | 1101 | 1764 | 1413 |
| | 161 | 1113 | 1766 | 1403 |
| | 146 | 1124 | 1770 | 1372 |
| | 132 | 1136 | 1771 | 1362 |
| | 117 | 1150 | 1773 | 1351 |
| | 104 | 1162 | 1774 | 1340 |
| | 71 | 1173 | 1775 | 1330 |
| | 55 | 1205 | 1776 | 1317 |
| | 42 | 1216 | 1777 | 1306 |
| | 27 | 1230 | 1777 | 1275 |
| | 13 | 1241 | 1777 | 1264 |
| | 0 | 1252 | 2000 | 1252 |

A random modulating wave, Rm(T) with a maximum frequency of Fclock/4, is first digitized by the digital converter 70. This digital value addresses the ROM phase look-up table 60. A ROM is fast enough to accomplish this function. The ROM output is then fed to the polarity generator 50.

The purpose of the polarity generator 50 is to supply an output that is X(T) on clock pulse N and −X(T) on clock pulse N+1 and so on. The sequence of X(T), −X(T), X(T) . . . is the input to phase adder 30. This is where the phase modulates the carrier. The output of the phase adder 30 is then converted into an amplitude by a sine look-up ROM 100, a digital-to-analog converter 110 and a low-pass filter 120. The output 130 of the low-pass filter 120 is the desired AM carrier.

If the modulation index, M, is to be variable, then the ROM phase look-up 60 is a RAM instead of ROM. The RAM contents are updated each time a new modulation index is requested. Since the synthesizer has a controller, which provides the $\Delta\phi$ and clock inputs, this same controller is used to calculate the RAM contents. If M is a constant, the ROM contents are fixed.

PRECISION AMPLITUDE ATTENUATION

Figure 7:
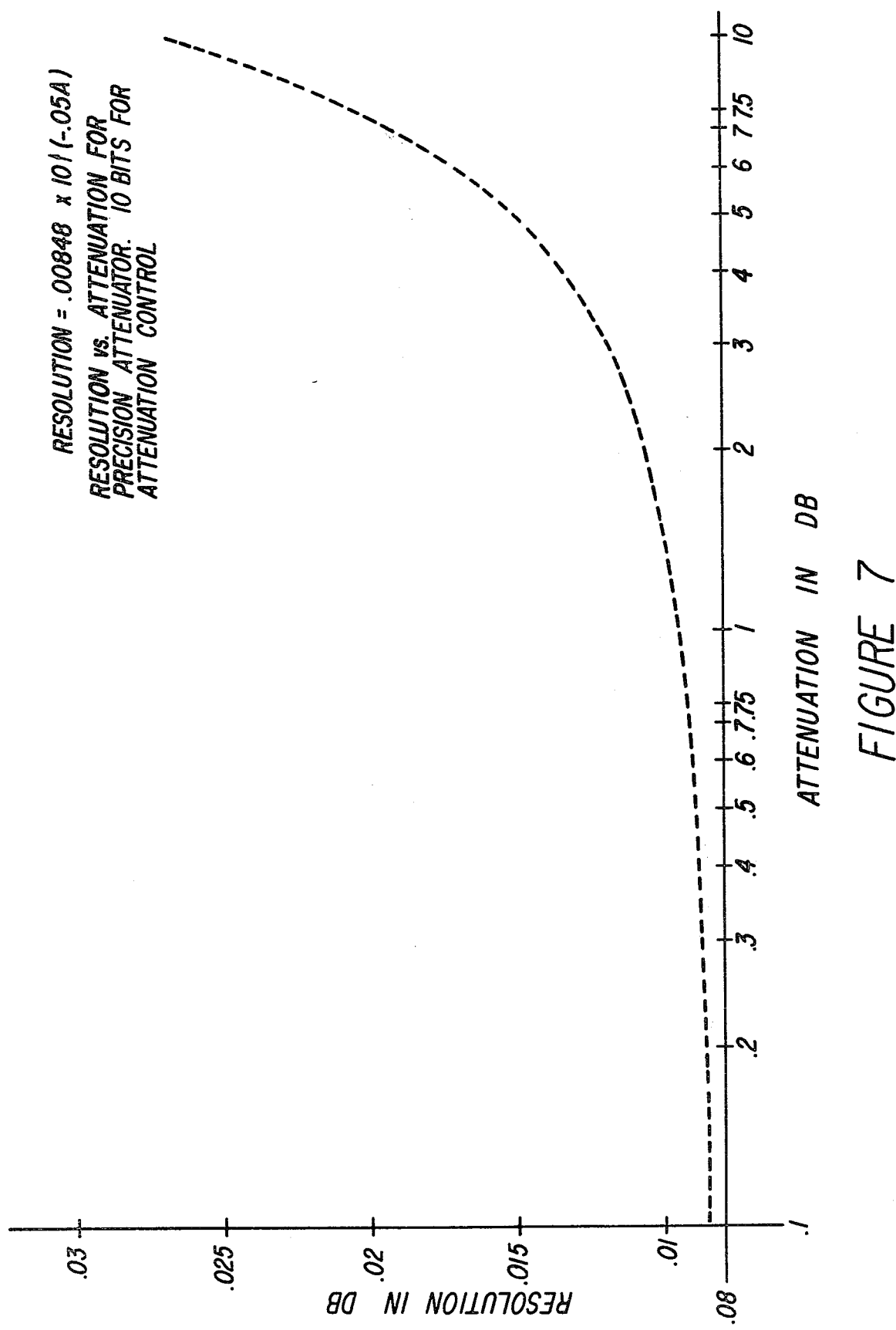
FIG. 7 is a graph showing resolution versus attenuation for a preferred precision attenuator made in accordance with the invention.

Referring to FIG. 7, another area where this method excels over others is in obtaining precision carrier attenuation with exceptional resolution. Assume an output at a selected frequency is defined as a reference 0 dB. With the invention the carrier is attenuated to any value within a selected range, such as a 10 dB range with a resolution as shown by FIG. 7. The resolution has limits based on the number bits of X(T). In this case X(T) is a constant for any value of time. The result is DC AM. Referring to FIGS. 3 and 8, the block diagram of FIG. 3 reduces to the simpler FIG. 8. This system requires no multiplication and minimal hardware. Equation (9) defines X(T)=X for the attenuator function.

$$X(T) = X = \text{constant} = \cos^{-1}(Rm/1024) \quad (9)$$

where Rm sets the attenuation as defined in equation (10)

$$\text{Atten} = 20 \log (Rm/1024) \text{ dB} \quad (10)$$

where $0 \leq Rm < 1024$ for a 10 bit system.

If Rm and X(T) are described by 10 bits, then the resolution is found from equation (11). This precision is useful in testing critical analog circuits or in use as a calibrator.

$$\text{Resolution(dB)} = (0.00848)10 \exp(-0.05 A) \quad (11)$$

where A is the attenuation below 0 dB of the carrier.

Referring to FIG. 8, a phase accumulator 2 generates the carrier rate. The adder 30 adds in the phase sequence X, −X, X, . . . etc. Because X(T) is a constant for a given value of attenuation a ROM is not needed to generate the phase. It can be conveniently calculated using the synthesizer controller. In this case the Rm variable represents the value of a constant DC input that would cause the identical attenuation. As before, the output of adder 30 is converted into the desired analog output.

DOUBLE SIDEBAND SUPPRESSED CARRIER

It is often required to generate double sideband suppressed carrier, DSBSC hereafter. DSBSC can be generated by using a traditional double "balanced" mixer. All so-called "balanced" modulators have a degree of unbalance due to component limitations. This unbalance causes the carrier to appear, although reduced in level, at the output port. By modifying equation (2), DSBSC is generated.

$$\text{hex}X(T) = \cos^{-1}[Rm(T)/2], \quad 0 \leq Rm(T) \leq 1. \quad (12)$$

Figure 9:
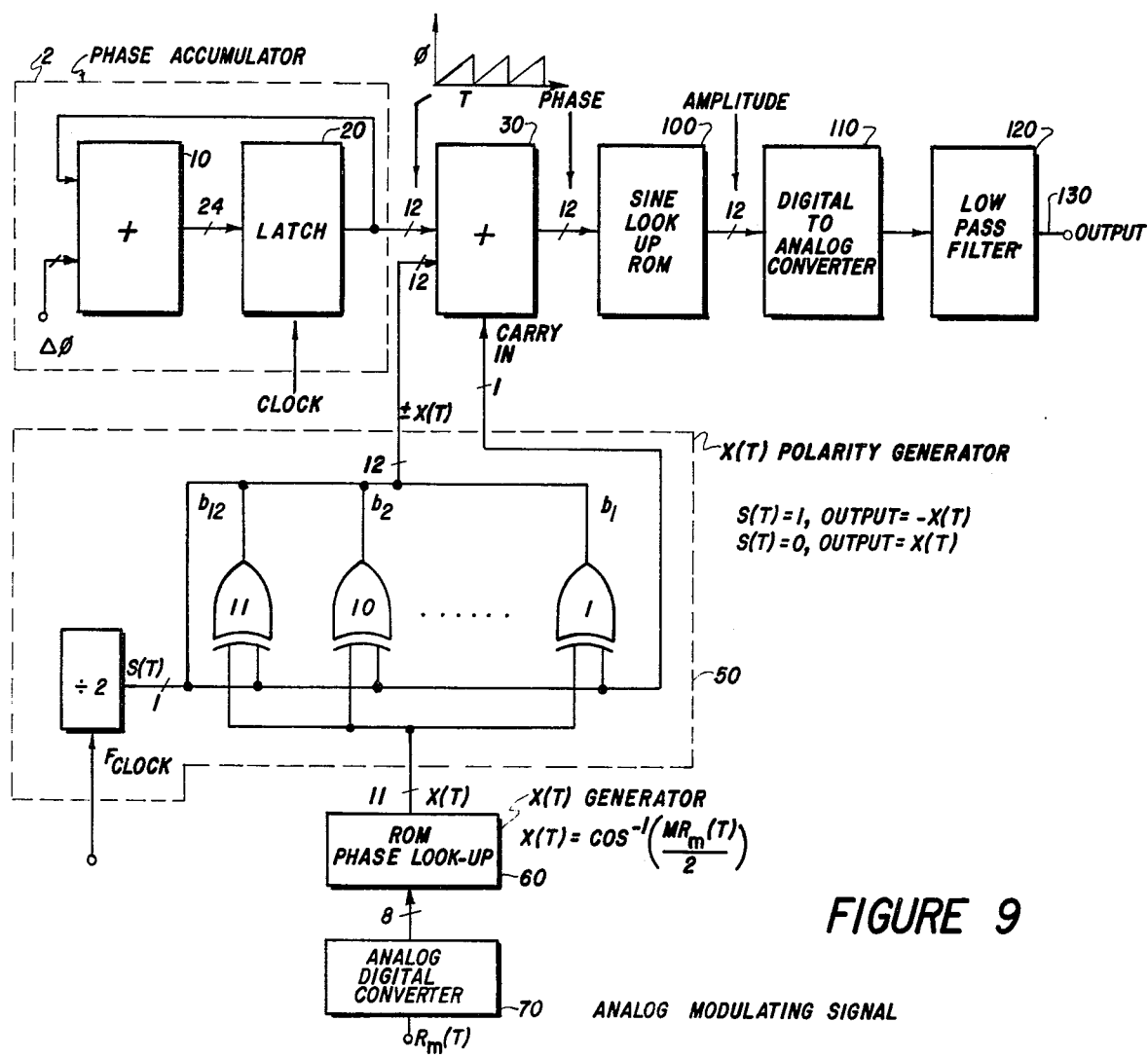
FIG. 9 is a block diagram of a preferred double sideband suppressed carrier generator built in accordance with the invention.

To eliminate the carrier term, the constant 0.5 is removed. Referring to FIG. 9, a block diagram for a preferred embodiment wherein X(T) is based on equation (12) is shown. Under this condition the carrier term is zero. The contents of the ROM 60 for DSBSC is given in Table 2 below. The ROM 60 is 256 words by 11 bits and the given values are in octal.

TABLE 2

| Byte location decimal: | 1-64 | 65-128 | 129-192 | 193-256 |
|---|---|---|---|---|
| | 1770 | 1252 | 2007 | 2525 |
| | 1760 | 1253 | 2017 | 2524 |
| | 1750 | 1253 | 2027 | 2524 |
| | 1740 | 1254 | 2037 | 2523 |
| | 1730 | 1255 | 2047 | 2522 |
| | 1720 | 1256 | 2057 | 2521 |
| | 1710 | 1260 | 2067 | 2517 |
| | 1700 | 1262 | 2077 | 2515 |
| | 1670 | 1263 | 2107 | 2514 |
| | 1660 | 1266 | 2117 | 2511 |
| | 1650 | 1270 | 2127 | 2507 |
| | 1641 | 1272 | 2136 | 2505 |
| | 1631 | 1275 | 2146 | 2502 |
| | 1621 | 1300 | 2156 | 2477 |
| | 1612 | 1303 | 2165 | 2474 |
| | 1602 | 1307 | 2175 | 2470 |
| | 1573 | 1312 | 2204 | 2465 |
| | 1563 | 1316 | 2214 | 2461 |
| | 1554 | 1322 | 2223 | 2455 |
| | 1544 | 1326 | 2233 | 2451 |
| | 1535 | 1332 | 2242 | 2445 |
| | 1526 | 1337 | 2251 | 2440 |
| | 1517 | 1343 | 2260 | 2434 |
| | 1510 | 1350 | 2267 | 2427 |
| | 1501 | 1355 | 2276 | 2422 |
| | 1472 | 1362 | 2305 | 2415 |
| | 1464 | 1370 | 2313 | 2407 |
| | 1455 | 1375 | 2322 | 2402 |
| | 1447 | 1402 | 2330 | 2375 |
| | 1440 | 1410 | 2337 | 2367 |
| | 1432 | 1416 | 2345 | 2361 |
| | 1424 | 1424 | 2353 | 2353 |
| | 1416 | 1432 | 2361 | 2345 |
| | 1410 | 1440 | 2367 | 2337 |
| | 1402 | 1447 | 2375 | 2330 |
| | 1375 | 1455 | 2402 | 2322 |
| | 1370 | 1464 | 2407 | 2313 |
| | 1362 | 1472 | 2415 | 2305 |
| | 1355 | 2501 | 2422 | 2276 |
| | 1350 | 1510 | 2427 | 2267 |
| | 1343 | 1517 | 2434 | 2260 |
| | 1337 | 1526 | 2440 | 2251 |

TABLE 2-continued

| Byte location decimal: | 1-64 | 65-128 | 129-192 | 193-256 |
|---|---|---|---|---|
| | 1332 | 1535 | 2445 | 2242 |
| | 1326 | 1544 | 2451 | 2233 |
| | 1322 | 1554 | 2455 | 2223 |
| | 1316 | 2563 | 2461 | 2214 |
| | 1312 | 1573 | 2465 | 2204 |
| | 1307 | 1602 | 2470 | 2175 |
| | 1303 | 1612 | 2474 | 2167 |
| | 1300 | 1621 | 2477 | 2156 |
| | 1275 | 1631 | 2502 | 2146 |
| | 1272 | 1641 | 2505 | 2136 |
| | 1270 | 1650 | 2507 | 2127 |
| | 1266 | 1660 | 2511 | 2117 |
| | 1263 | 1670 | 2514 | 2107 |
| | 1262 | 1700 | 2515 | 2077 |
| | 1260 | 1710 | 2517 | 2067 |
| | 1256 | 1720 | 2521 | 2057 |
| | 1255 | 1730 | 2522 | 2047 |
| | 1254 | 1740 | 2523 | 2037 |
| | 1253 | 1750 | 2524 | 2027 |
| | 1253 | 1760 | 2524 | 2017 |
| | 1252 | 1770 | 2525 | 2007 |
| | 1252 | 2000 | 2525 | 2000 |

100% AMPLITUDE MODULATION

Yet another application of the present invention is in obtaining a modulation index of exactly 100%. with no limiting. Using analog components it is difficult to obtain exactly 100% AM because of limiting problems. 100% AM is useful as a calibration signal when testing receivers or modulation analyzers.

SINGLE SIDEBAND

Generating single sideband, SSB hereafter, usually requires either special sideband suppression filters or 90° phase shifters. Both methods have tradeoffs that degrade the resulting spectrum. For simple two tone signals, as usually required in testing, the present invention generates the signals without a 90° phase shift or sideband filters.

Figure 10:
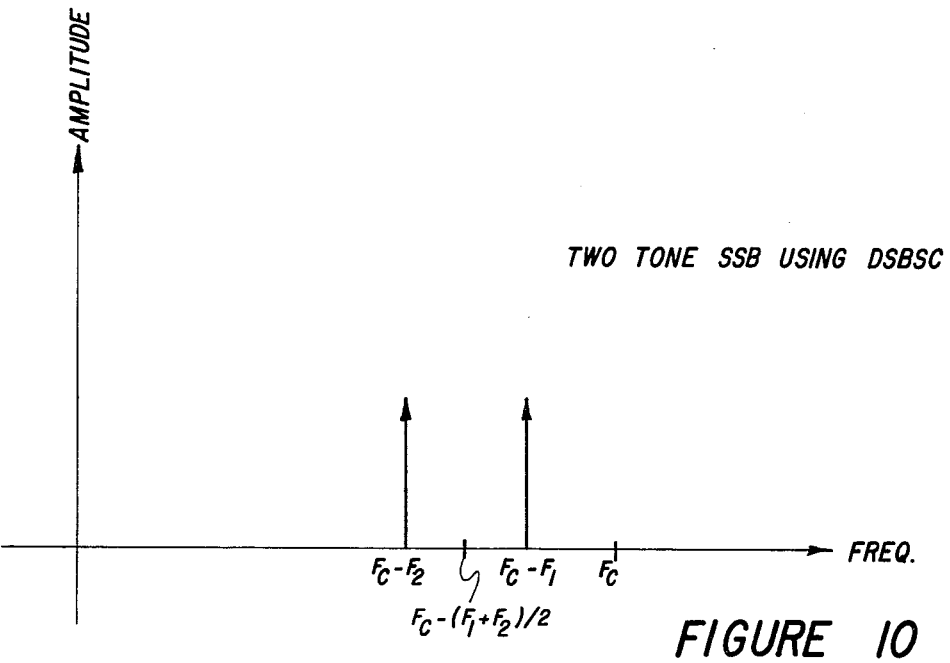
FIG. 10 is a graph showing a two-tone lower single sideband spectrum.

Referring to FIG. 10, a two tone LSSB spectrum is shown. This is generated by using the DSBSC scheme described above. In this case a user enters the two frequencies $F_1$, $F_2$ into a synthesizer controller which applies an appropriate $\Delta\phi$, clock and Rm(T). The controller then generates a DSBSC wave around a pseudo carrier of $Fc-(F_1+F_2)/2$. The two tone SSB system is equivalent to a DSBSC signal. An USSB signal is likewise generated around a psuedo carrier of $Fc+(F_1+F_2)/2$.

We claim:
1. Digital apparatus comprising:
   phase accumulation means for accumulating a linearly increasing phase count and producing a digital phase signal corresponding to the phase count in response to receiving a differential phase input;
   adding means having a first input coupled to receive the digital phase signal, a second input and an output for adding signals applied to the first and second inputs and producing a summation signal corresponding to the addition at the output;
   sine look-up means coupled to receive the adding means output for producing a digital sine value signal in response to the summation signal;
   digital-to-analog conversion means coupled to receive the digital sine value signal for producing an analog signal output in response to the digital sine value signal;
   filtering means coupled to receive the analog signal output for producing a selected spectrum of the analog signal as an output;
   analog-to-digital conversion means coupled to receive an applied input signal for producing a digital modulation signal in response to the applied input signal;
   phase conversion means coupled to receive the digital modulation signal for producing a digital modulation phase signal in response to the digital modulation signal; and
   polarity generation means coupled to the adding means second input and to the phase conversion means to receive the digital modulation signal for producing an alternately polarized digital modulation signal and applying the alternately polarized digital modulation signal to the adding means.
2. Apparatus as in claim 1 wherein phase accumulation means comprise:
   an adder having a first input coupled to receive the differential phase input, a second input and an output; and
   a latch coupled to receive the adder output and an applied clock signal and an output coupled to the adder second input.
3. Apparatus as in claim 1 wherein sine look-up means comprises a read-only memory.
4. Apparatus as in claim 1 wherein sine look-up means comprises a random-access memory.
5. Apparatus as in claim 1 wherein filtering means comprises a low-pass filter.
6. Apparatus as in claim 1 wherein phase conversion means comprises a read-only memory.
7. Apparatus as in claim 1 wherein phase conversion means comprises a random-access memory.
8. Apparatus as in claim 1 wherein polarity generation means comprise:
   a plurality of exclusive OR gates, each having a first input, a second input and an output;
   dividing means coupled to receive an applied clock signal for producing a divided clock signal as an intput;
   means for coupling the first input of each of the plurality of exclusive OR gates to receive the divided clock signal; and
   means for coupling the second input of each of the plurality of exclusive OR gates to receive the digital modulation signal.
9. Digital apparatus comprising:
   phase accumulation means for accumulating a linearly increasing phase count and producing a digital phase signal corresponding to the phase count in response to receiving a differential phase input;
   adding means having a first input coupled to receive the digital phase signal, a second input and an output for adding signals applied to the first and second inputs and producing a summation signal corresponding to the addition at the output;
   sine look-up means coupled to receive the adding means output for producing a digital sine value signal in response to the summation signal;
   digital-to-analog conversion means coupled to receive the digital sine value signal for producing an analog signal output in response to the digital sine value signal;
   filtering means coupled to receive the analog signal output for producing a selected spectrum of the analog signal as an output;

phase conversion means coupled to receive an applied digital modulation signal for producing a digital modulation phase signal in response to the digital modulation signal; and polarity generation means coupled to the adding means second input and to receive the digital modulation signal for producing an alternately polarized digital modulation signal and applying the alternately polarized digital modulation signal to the adding means.

10. Apparatus as in claim 9 comprising analog-to-digital conversion means coupled to receive an applied input signal for producing the digital modulation signal in response to the applied input signal.

11. Apparatus as in claim 9 wherein phase accumulation means comprise:

an adder having a first input coupled to receive the differential phase input, a second input and an output; and a latch coupled to receive the adder output and an applied clock signal and an output coupled to the adder second input.

12. Apparatus as in claim 9 wherein sine look-up means comprises a read-only memory.

13. Apparatus as in claim 9 wherein sine look-up means comprises a random-access memory.

14. Apparatus as in claim 9 wherein filtering means comprises a low-pass filter.

15. Apparatus as in claim 9 wherein phase conversion means comprises a read-only memory.

16. Apparatus as in claim 9 wherein phase conversion means comprises a random-access memory.

17. Apparatus as in claim 9 wherein polarity generation means comprise:

a plurality of exclusive OR gates, each having a first input, a second input and an output;

dividing means coupled to receive an applied clock signal for producing a divided clock signal as an output;

means for coupling the first input of each of the plurality of exclusive OR gates to receive the divided clock signal; and means for coupling the second input of each of the plurality of exclusive OR gates to receive the digital modulation signal.

18. Digital precision carrier attenuation apparatus comprising:

phase accumulation means for accumulating a linearly increasing phase count and producing a digital phase signal corresponding to the phase count in response to receiving a differential phase input;

adding means having a first input coupled to receive the digital phase signal, a second input and an output for adding signals applied to the first and second inputs and producing a summation signal corresponding to the addition at the output;

sine look-up means coupled to receive the adding means output for producing a digital sine value signal in response to the summation signal;

digital-to-analog conversion means coupled to receive the digital sine value signal for producing an analog signal output in response to the digital sine value signal;

filtering means coupled to receive the analog signal output for producing a selected spectrum of the analog signal as an output; and polarity generation means coupled to the adding means second input and a digital input signal for producing an alternately polarized digital signal and applying the alternately polarized digital signal to the adding means.

19. Apparatus as in claim 18 comprising an analog-to-digital conversion means coupled to receive an applied input signal for producing the digital signal in response to the applied input signal.

20. Apparatus as in claim 18 wherein phase accumulation means comprise:

an adder having a first input coupled to receive the differential phase input, a second input and an output; and a latch coupled to receive the adder output and an applied clock signal and an output coupled to the adder second input.

21. Apparatus as in claim 18 wherein sine look-up means comprises a read-only memory.

22. Apparatus as in claim 18 wherein sine look-up means comprises a random-access memory.

23. Apparatus as in claim 18 wherein filtering means comprises a low-pass filter.

24. A method for digitally amplitude-modulating an applied carrier signal in the phase domain comprising the steps of:

phase-converting a modulating signal;

alternating the polarity of the phase-converted modulating signal;

accumulating a linearly-increasing phase count;

adding the polarity alternating phase-converted modulating signal and the accumulated phase count;

converting the sum of the addition to phase values of a sine wave;

digitally converting the phase values to an analog signal; and filtering the analog signal.

* * * * *

UNITED STATES PATENT AND TRADEMARK OFFICE
CERTIFICATE OF CORRECTION

PATENT NO. : 4,331,941

DATED : May 25, 1982

INVENTOR(S) : Al Kovalick, et al.

It is certified that error appears in the above-identified patent and that said Letters Patent are hereby corrected as shown below:

Column 6, line 23, "hexX(T)" should read --Let X(T)--.

Signed and Sealed this

Fourteenth Day of September 1982

[SEAL]

Attest:

GERALD J. MOSSINGHOFF

Attesting Officer

Commissioner of Patents and Trademarks